(12) United States Patent
Guillemenet et al.

(10) Patent No.: US 9,053,782 B2
(45) Date of Patent: Jun. 9, 2015

(54) MEMORY CELL WITH VOLATILE AND NON-VOLATILE STORAGE

(75) Inventors: Yoann Guillemenet, Crest (FR); Lionel Torres, Combaillaux (FR)

(73) Assignees: Centre National de la Recherche Scientifique (FR); Universite Montpellier 2 (FR)

( * ) Notice: Subject to any disclaimer, the term of this patent is extended or adjusted under 35 U.S.C. 154(b) by 0 days.

(21) Appl. No.: 14/126,051

(22) PCT Filed: Jun. 14, 2012

(86) PCT No.: PCT/EP2012/061267
§ 371 (c)(1),
(2), (4) Date: Mar. 6, 2014

(87) PCT Pub. No.: WO2012/171988
PCT Pub. Date: Dec. 20, 2012

(65) Prior Publication Data
US 2014/0167816 A1 Jun. 19, 2014

(30) Foreign Application Priority Data
Jun. 15, 2011 (FR) .................................... 11 55191

(51) Int. Cl.
*G11C 7/00* (2006.01)
*G11C 13/00* (2006.01)
(Continued)

(52) U.S. Cl.
CPC ............ *G11C 13/0002* (2013.01); *G11C 14/00* (2013.01); *G11C 11/161* (2013.01); *G11C 14/0054* (2013.01); *G11C 14/0081* (2013.01); *H03K 19/177* (2013.01)

(58) Field of Classification Search
CPC ...................................................... H03K 19/177
USPC .................... 326/37–41, 46; 365/148, 189.19
See application file for complete search history.

(56) References Cited

U.S. PATENT DOCUMENTS

| 4,006,469 A | 2/1977 | Leehan et al. |
| 5,973,965 A | 10/1999 | Berthold et al. |

(Continued)

FOREIGN PATENT DOCUMENTS

| EP | 1134746 A2 | 9/2001 |
| FR | 2966636 A1 | 4/2012 |

(Continued)

OTHER PUBLICATIONS

IBM , "Combined Single/Dual-Port Array Approach with 6-Device Cell", "IBM Technical Disclosure Bulletin", Jun. 1, 1988, pp. 291-292, vol. 31, No. 1, Publisher: IBM Corp., Published in: US.

(Continued)

*Primary Examiner* — Don Le
(74) *Attorney, Agent, or Firm* — Kaplan Breyer Schwarz & Ottesen, LLP (57) ABSTRACT

The invention concerns a memory device comprising at least one memory cell comprising: first and second pairs of cross-coupled transistors; and a first resistance switching element (202) coupled between a first supply voltage (VDD, GND) and a first transistor of said first pair of transistors and programmed to have one of first and second resistances; and control circuitry adapted to store a data value ($D_{NV}$) at said first and second storage nodes by coupling said first storage node to said second supply voltage ($V_{DD}$, GND), the data value being determined by the programmed resistance of the first resistance switching element.

15 Claims, 6 Drawing Sheets

(51) Int. Cl.
G11C 14/00 (2006.01)
G11C 11/16 (2006.01)
H03K 19/177 (2006.01)

(56) References Cited

U.S. PATENT DOCUMENTS

| | | | |
|---|---|---|---|
| 6,172,899 B1 | 1/2001 | Marr et al. | |
| 7,495,945 B2 | 2/2009 | Roehr | |
| 7,760,538 B1* | 7/2010 | Paak | 365/148 |
| 7,764,081 B1 | 7/2010 | Tuan et al. | |
| 7,796,417 B1* | 9/2010 | Lewis | 365/148 |
| 8,508,983 B2* | 8/2013 | Wang et al. | 365/154 |
| 8,605,490 B2* | 12/2013 | Fackenthal | 365/154 |
| 8,773,896 B2 | 7/2014 | Shukh | |
| 2003/0161184 A1 | 8/2003 | Lee et al. | |
| 2003/0204689 A1 | 10/2003 | Shimoda | |
| 2004/0125643 A1* | 7/2004 | Kang et al. | 365/148 |
| 2004/0141363 A1* | 7/2004 | Ohtsuka et al. | 365/154 |
| 2006/0181916 A1* | 8/2006 | Roehr | 365/148 |
| 2007/0041242 A1* | 2/2007 | Okazaki et al. | 365/154 |
| 2008/0089146 A1 | 4/2008 | Fujito et al. | |
| 2009/0109734 A1 | 4/2009 | Hanafi | |
| 2009/0190409 A1 | 7/2009 | Dittrich et al. | |
| 2009/0268513 A1 | 10/2009 | De Ambroggi et al. | |
| 2010/0080042 A1* | 4/2010 | Lamorey | 365/148 |
| 2010/0188891 A1 | 7/2010 | Taniguchi et al. | |
| 2010/0202191 A1 | 8/2010 | Ahn et al. | |
| 2010/0259975 A1 | 10/2010 | Toda | |
| 2010/0271866 A1 | 10/2010 | Sakimura et al. | |
| 2011/0085372 A1* | 4/2011 | Fackenthal | 365/156 |
| 2011/0110142 A1 | 5/2011 | Kitagawa et al. | |
| 2011/0122709 A1 | 5/2011 | Kim et al. | |
| 2011/0208904 A1 | 8/2011 | Fujito et al. | |
| 2013/0135008 A1 | 5/2013 | Zhang et al. | |
| 2014/0269003 A1 | 9/2014 | Guillemenet et al. | |

FOREIGN PATENT DOCUMENTS

| | | |
|---|---|---|
| FR | 2970589 A1 | 7/2012 |
| JP | 2003157671 A | 5/2003 |
| WO | 2007045202 A1 | 4/2007 |
| WO | 2008112746 A2 | 9/2008 |
| WO | 2010065691 | 6/2010 |

OTHER PUBLICATIONS

Officer: Balaguer Lopez, J , "International Search Report for International Application No. PCT/EP2012/061267," Sep. 16, 2012, Publisher: PCT, Published in: EP.
Zhao et al., "TAS-MRAM based Non-volatile FPGA logic circuit", Dec. 1, 2007, pp. 153-160, Publisher: International Conference on Field-Programmable Technology. ICFPT 2007. IEEE, XP031208385.
Yoann Guillemenet et al, "A Non-Volatile Run-Time FPGA Using Thermally Assisted Switching MRAMS," pp. 421-426.
G. Grynkewich et al, "Nonvolatile Magnetoresistive Random-Access Memory Based on Magnetic Tunnel Junctions," Nov. 2004, pp. 818-821.
William C. Black, Jr. et al., "Programmable logic using giant-magnetoresistance and spin-dependent tunneling devices invited," May 1, 2000, pp. 6674-6679, vol. 87, No. 9, Publisher: AIP Publishing.
Yamamoto et al., "Nonvolatile Static Random Access Memory Using Resistive Switching Devices: Variable-Transconductance Metal Oxide Semiconductor Field-Effect-Transistor Approach," Japanese Journal of Applied Physics, Apr. 1, 2010, p. 40209-1. vol. 49, No. 4, Publisher: Japan Society of Applied Physics, Published in: JP.
Yoan Guillemenet et al., (related) U.S. Appl. No. 13/980,529, filed Feb. 13, 2014, Publisher: USPTO.

Damien Czarik, "International Search Report," Jul. 26, 2012, for International Patent Application No. PCT/EP2012/050800, which corresponds to related U.S. Appl. No. 13/980,529, Publisher: WIPO.
Prenat Guillaume et al., (related) U.S. Appl. No. 13/980,555, filed Mar. 20, 2014, Publisher: USPTO.
Yoan Guillemenet et al., (related) U.S. Appl. No. 13/980,559, filed Mar. 13, 2014, Publisher: USPTO.
Yoan Guillemenet et al., (related) U.S. Appl. No. 13/980,558, filed Oct. 30, 2013, Publisher: USPTO.
Damien Czarik, "International Search Report," Jul. 26, 2012, for International Application No. PCT/EP2012/050772, which corresponds to related U.S. Appl. No. 13/980,558, Publisher: WIPO.
Tan T. Nguyen, "Notice of Allowance," Sep. 26, 2014, for related U.S. Appl. No. 13/980,558, Publisher: USPTO.
Jim Lindquist, "International Search Report," Dec. 20, 2012, for International Patent Application No. PCT/EP2012/061268, which corresponds to related U.S. Appl. No. 14/126,067, Publisher: WIPO.
Michael Thanh Tran, "Non-Final Office Action" Oct. 8, 2014, for related U.S. Appl. No. 14/126,067, Publisher: USPTO.
Yoan Guillemenet et al., (related) U.S. Appl. No. 14/126,067, filed Sep. 18, 2014, Publisher: USPTO.
Gregory Di Pendina et al., (related) U.S. Appl. No. 14/324,110, filed Jul. 4, 2014, Publisher: Not Published.
Balaguer Lopez, J., "French Search Report," dated Mar. 7, 2014, for French Patent Application No. 13/56637, which corresponds to related U.S. Appl. No. 14/324,110.
Yue Zhang et al, "Compact Modeling of Perpendicular-Anisotrophy CoFeB/MgO Magnetic Tunnel Junctions, (related to U.S. Appl. No. 14/446,044)", Mar. 2012, pp. 819-826, vol. 59, No. 3.
Lionel Torres et al., "Evaluation of hybrid MRAM/CMOS cells for reconfigurable computing,".
Corinne Havard, "French Search Report," dated Jun. 12, 2014, for French Application No. 13/57536, which corresponds to related U.S. Appl. No. 14/446,044.
Delphine Mesplede, "International Search Report," Oct. 31, 2013, for International Application No. PCT/FR2013/050910, which corresponds to related U.S. Appl. No. 14/395,555, Publisher: WIPO.
Luqiao Liu, et al, "Magnetic switching by spin torque from the spin Hall effect," Published in: US.
Ioan Mihai Miron et al, "Perpendicular switching of a single ferromagnetic layer induced by in-plane current injection," Aug. 11, 2011, pp. 189-194, vol. 476.
L. Q. Liu et al., "Spin-Torque Switching with the Giant Spin Hall Effect of Tantalum", 2012, vol. 336, No. 555.
Sasikanth Manipatruni et al, "Voltage and Energy-Delay Performance of Giant Spin Hall Effect Switching for Magnetic Memory and Logic," pp. 1-16.
Simin Baharlou, "International Preliminary Report on Patentability," Oct. 28, 2014, for International Application No. PCT/FR2013/050910, which corresponds to related U.S. Appl. No. 14/395,555, Publisher: WIPO.
Yolaine Cussac, "International Preliminary Report on Patentability," Jul. 23, 2013, for International Patent Application No. PCT/EP2012/050800. which corresponds to related U.S. Appl. No. 13/980,529, Publisher: WIPO.
Damien Czarik, "International Search Report," Jul. 26, 2012, for International Patent Application No. PCT/EP2012/050798, which corresponds to related U.S. Appl. No. 13/980,555, Publisher: WIPO.
Agnes Wittmann-Regis, "International Preliminary Report on Patentability," Jul. 23, 2013, for International Patent Application No. PCT/EP2012/050798, which corresponds to related U.S. Appl. No. 13/980,555, Publisher: WIPO.
Damien Czarik, "International Search Report," Jul. 26, 2012, for International Patent Application No. PCT/EP2012/050767, which corresponds to related U.S. Appl. No. 13/980,559, Publisher: WIPO.
Agnes Wittmann-Regis, "International Preliminary Report on Patentability," Jul. 23, 2013, for International Patent Application No. PCT/EP2012/050767, which corresponds to related U.S. Appl. No. 13/980,559, Publisher: WIPO.
Agnes Wittmann-Regis, "International Preliminary Report on Patentability," Jul. 23, 2013, for International Patent Application No. PCT/EP2012/050772, which corresponds to related U.S. Appl. No. 13/980,558, Publisher: WIPO.

(56) References Cited

OTHER PUBLICATIONS

Agnes Wittmann-Regis, "International Preliminary Report on Patentability," Dec. 17, 2013, for corresponding International Patent Application No. PCT/EP2012/061267, Publisher: WIPO.

Agnes Wittmann-Regis, "International Preliminary Report on Patentability," Dec. 17, 2013, for International Patent Application No. PCT/EP2012/061268, which corresponds to related U.S. Appl. No. 14/126,067,Publisher: WIPO.

Prenat Guillaume et al, (related) U.S. Appl. No. 14/395,555, Oct. 20, 2014, Publisher: Not Published.

Related U.S. Appl. No. 14/446,044, Publisher: Not Published.

Tan T. Nguyen, "Supplemental Notice of Allowance," Dec. 4, 2014, for related U.S. Appl. No. 13/980,558 , Publisher: USPTO.

Dylan C. White, "Non-Final Office Action," dated Dec. 29, 2014, issued in related U.S. Appl. No. 13/980,529.

Tan Nguyen, "Notice of Allowance," dated Jan. 21, 2015, issued in related U.S. Appl. No. 13/980,558.

Balaguer Lopez, J., "European Search Report", dated Nov. 13, 2014, issued in related EP Application No. 14175842.5.

Saied Tehran, et al, "Magnetoresistive Random Access Memory Using Magnetic Tunnel Junctions", "Proceedings of the IEEE", May 2003, pp. 703-714, vol. 91, No. 5.

I L Prejbeanu et al., "Thermally assisted MRAM", Journal of Physics: Condensed Matter, Apr. 6, 2007, p. 23 Publisher: IOP Publishing, Published in: UK.

* cited by examiner

MEMORY CELL WITH VOLATILE AND NON-VOLATILE STORAGE

FIELD OF THE INVENTION

The present invention relates to a programmable volatile/non-volatile memory cell, and to a method of reading one or more non-volatile bits from a programmable non-volatile memory cell.

BACKGROUND OF THE INVENTION

Figure 1:
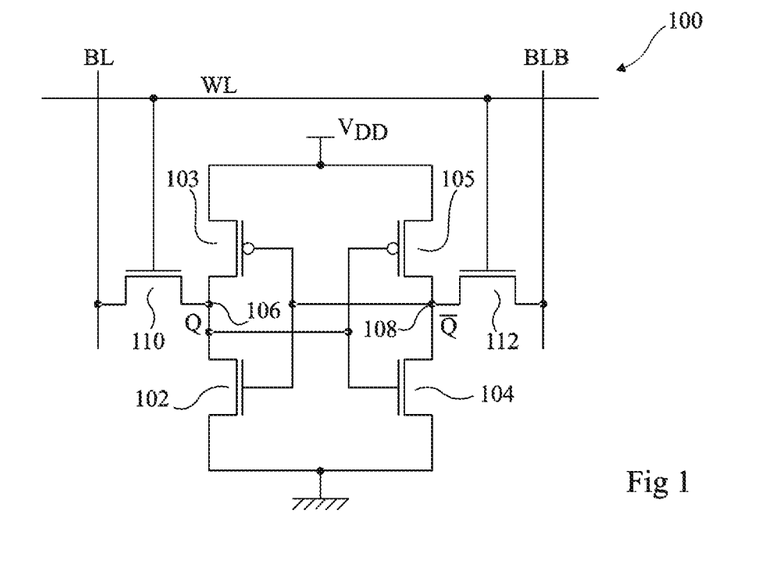
FIG. 1 (described above) illustrates a volatile SRAM cell.

FIG. 1 illustrates a typical static random access memory (SRAM) cell 100. A first inverter is formed of an N-channel MOS (NMOS) transistor 102 and P-channel MOS (PMOS) transistor 103 coupled in series between a supply voltage $V_{DD}$ and a ground voltage. A second inverter is formed of an NMOS transistor 104 and a PMOS transistor 105 also coupled in series between the supply voltage $V_{DD}$ and the ground voltage. The gates of transistors 104 and 105 are coupled to a node 106 coupled to the drains of transistors 102 and 103, while the gates of transistors 102 and 103 are coupled to a node 108 coupled to the drains of transistors 104 and 105, such that the inverters form a latch.

The nodes 106 and 108 store complementary voltage states Q and $\overline{Q}$, permitting one bit of data to be memorized by the cell. Node 106 is coupled to a bit line BL via an N-channel MOS (NMOS) transistor 110, while node 108 is coupled to a complementary bit line BLB via an NMOS transistor 112. The gates of transistors 110 and 112 are coupled to a word line WL, and are activated by a low signal allowing data to be written to or read from the cell 100.

The circuit 100 has advantage of being relatively quick to access during read and write operations. However, a disadvantage is that, as with all volatile memory cells, the stored data is lost if the supply voltage $V_{DD}$ is removed.

Flash memory is an example of a programmable non-volatile memory. A disadvantage with flash memory is that it is relatively slow to access when compared to the SRAM cell of FIG. 1, and requires a relatively high supply voltage. Furthermore, the Flash technology is difficult to integrate with CMOS, and has relatively low endurance.

In many applications there is a need for a programmable memory cell capable of storing non-volatile data, and having increased access speeds.

SUMMARY OF THE INVENTION

It is an aim of embodiments of the present invention to at least partially address one or more needs in the prior art.

According to one aspect of the present invention, there is provided a memory device comprising: at least one memory cell comprising: first and second pairs of transistors each pair coupled in series between first and second supply voltages, wherein a first storage node between the first pair of transistors is coupled to control terminals of the second pair of transistors, and a second storage node between the second pair of transistors is coupled to control terminals of the first pair of transistors; and a first resistance switching element coupled between said first supply voltage and a first transistor of said first pair of transistors and programmed to have one of first and second resistances; a fifth transistor coupled between said first storage node and a first access line; and a sixth transistor coupled between said second storage node and a second access line, wherein said fifth transistor is controlled by a first control line and said sixth transistor is controlled by a second control line independent of the first control line.

According to one embodiment, the memory device further comprises control circuitry adapted to store a data value at said first and second storage nodes by coupling said first storage node to said first supply voltage and then coupling said first storage node to said second supply voltage, the data value being determined by the programmed resistance of the first resistance switching element.

According to a further embodiment, the control circuitry is arranged to couple said first storage node to said first and second supply voltages by activating said fifth transistor.

According to a further embodiment, the at least one memory cell further comprises: a second resistance switching element coupled between said first supply voltage and a first transistor of said second pair of transistors and programmed to have one of first and second resistances.

According to a further embodiment, the memory device further comprises: control circuitry adapted to: store a first data value at said first and second storage nodes by coupling said first storage node to said first supply voltage and then coupling said first storage node to said second supply voltage, the data value being determined by the programmed resistance of the first resistance switching element; and store a second data value at said first and second storage nodes by coupling said second storage node to said first supply voltage, and then coupling said second storage node to said second supply voltage, the second data value being determined by the programmed resistance of the second resistance switching element.

According to a further embodiment, the at least one memory cell further comprises a further resistance switching element coupled between said second supply voltage and a second transistor of said first pair of transistors and programmed to have one of first and second resistances.

According to a further embodiment, the memory device further comprises control circuitry adapted to store a further data value at said first and second storage nodes by coupling said first storage node to said first supply voltage, the data value being determined by the programmed resistance of the further resistance switching element.

According to a further embodiment, the control circuitry is adapted to select between storing the data value and the further data value at said first and second storage nodes by applying said first or second supply voltage to said first storage node.

According to a further embodiment, the at least one memory cell further comprises: a third resistance switching element coupled between said second supply voltage and a second transistor of said first pair of transistors and programmed to have one of said first and second resistances; and a fourth resistance switching element coupled between said second supply voltage and a second transistor of said second pair of transistors and programmed to have one of said first and second resistances; and control circuitry adapted to store a further data value at said first and second storage nodes by coupling said first storage node to said first supply voltage, the data value being determined by the relative resistances of the third and fourth resistance switching elements.

According to a further embodiment, the memory device further comprises programming circuitry adapted to program the resistances of said first resistance switching element based on input data.

According to a further embodiment, the first resistance switching element is one of: an oxide resistive element; a conductive bridging element; a phase change element; a programmable metallization element; a spin-torque-transfer element; a thermally assisted switching element and a field-induced magnetic switching element.

According to a further aspect of the present invention, there is provided a random access memory comprising an array of the above memory devices.

According to yet a further aspect of the present invention, there is provided a field programmable gate array comprising at least one multiplexer comprising an input coupled to at least one of the above memory devices.

According to a yet further aspect of the present invention, there is provided a field programmable gate array comprising: a plurality of configurable logic blocks; and at least one switching block adapted to interconnect said plurality of configurable logic blocks, wherein said at least one switching block comprises the above memory device.

According to another aspect of the present invention, there is provided a method of transferring a data value from non-volatile storage of a memory cell to first and second volatile storage nodes of said memory cell, wherein the memory cell comprises first and second pairs of transistors each pair coupled in series between first and second supply voltages, wherein a first storage node between the first pair of transistors is coupled to control terminals of the second pair of transistors, and a second storage node between the second pair of transistors is coupled to control terminals of the first pair of transistors; a first resistance switching element coupled between said first supply voltage and a first transistor of said first pair of transistors and programmed to have one of first and second resistances; a fifth transistor coupled between said first storage node and a first access line; and a sixth transistor coupled between said second storage node and a second access line, wherein said fifth transistor is controlled by a first control line and said sixth transistor is controlled by a second control line independent of the first control line, the method comprising: coupling said first storage node to said first supply voltage and then coupling said first storage node to said second supply voltage, the data value being determined by the programmed resistance of the first resistance switching element.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

Throughout the figures, like features have been labelled with like reference numerals.

DETAILED DESCRIPTION OF EMBODIMENTS OF THE PRESENT DISCLOSURE

Figure 2:
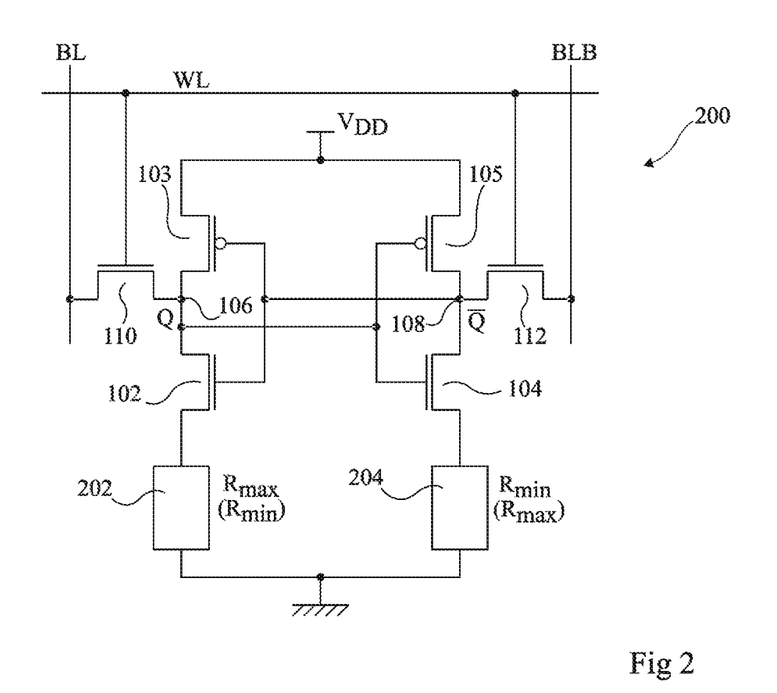
FIG. 2 illustrates a memory cell with non-volatile data storage according to an embodiment of the present disclosure.

FIG. 2 illustrates a memory cell 200 that stores, in addition to one bit of volatile data, one bit of non-volatile data. The volatile data is stored in electronic form by a latch. The non-volatile data however is stored by the physical state of a pair of resistance switching elements, as will now be described.

The memory cell 200 is similar to the SRAM cell 100 of FIG. 1 described above, and the common portions will not be described again in detail. The difference is that the memory cell 200 additionally comprises resistance switching elements 202 and 204, which are coupled between the respective sources of transistors 102 and 104 and the ground voltage.

The resistance switching elements 202 and 204 are any resistive elements switchable between two resistance values. Such elements maintain the programmed resistive state even after a supply voltage is removed. Elements 202, 204 are programmed to have opposite values, and the relative resistance values of the elements indicate one binary data value.

For example, the resistance switching elements 202, 204 are based on magnetic tunnelling junctions (MTJs), such as field-induced magnetic switching (FIMS) elements, thermally assisted switching (TAS) elements, STT (spin-torque-transfer) elements, or those of Toggle MRAM. FIMS-MRAM (magnetic random access memory) are for example discussed in more detail in the publication titled "Magnetoresistive random access memory using magnetic tunnel junctions", S. Tehrani, Proceedings of IEEE, 91(5):3707-714, May 2003. TAS-MRAM are for example discussed in more detail in the publication titled "Thermally Assisted MRAM", Prejbeanu et al.

Alternatively, the resistance switching elements 202, 204 could be other types of resistance switching memory devices, including those used in programmable metallization cells (PMC), such as oxide resistive RAM (OxRRAM), conductive bridging RAM (CBRAM), or phase change RAM (PCRAM).

Whatever the type of resistance switching element, information is stored by setting one of the elements at a relatively high resistance ($R_{max}$), and the other at a relatively low resistance ($R_{min}$). Each of the resistance switching elements 202, 204 for example has just two resistive states corresponding to the high and low resistances $R_{max}$ and $R_{min}$, although the exact values of $R_{min}$ and $R_{max}$ may vary depending on conditions such as temperature, process variations etc. The non-volatile data value represented by the resistive elements 202, 204 depends on which of the resistive elements is at the resistance $R_{max}$ and $R_{min}$, in other words on the relative resistances. The resistance elements 202, 204 are for example selected such that $R_{max}$ is always significantly greater than $R_{min}$, for example at least 20 percent greater. In general, the ratio between the resistance $R_{max}$ and the resistance $R_{min}$ is for example between 1.7 and 5 for an MRAM, or more generally between 1.2 and 10000. In one example, $R_{min}$ is in the region of 2.5 k ohms, and $R_{max}$ is in the region of 5 k ohms, although many other values are possible.

In operation, for reading and writing data to the volatile portion of the memory cell 200, in other words to the storage nodes 106 and 108, the process is the same as for the memory cell 100 of FIG. 1, and is not affected by the programmed resistance values of the resistance switching elements 202 and 204. Briefly, writing a bit of data to nodes 106, 108 involves applying, while transistors 110 and 112 are turned on, a high or low voltage to bit line BL depending on the data to be stored, and the opposite voltage to bit line BLB. Reading the data from nodes 106 and 108 involves pre-charging the bit lines BL and BLB, and then turning on transistors 110 and 112 and determining which bit line voltage drops first, with the aid of a sense amplifier (not illustrated), which amplifies the voltage difference between the bit lines. Preferably, so as not to slow the read and write operations to the volatile storage nodes and to prevent a bit-flip during a read operation, the value of $R_{max}$ is chosen not to be greater than around 5 k ohms, although this value will depend on the particular technology used, and in particular the on resistance of the transistors.

Independently of this normal SRAM operation, the resistance switching elements may be programmed to store non-volatile data, and the memory cell may be controlled to transfer this data, from physical storage determined by the resistive states of elements 202, 204, to electronic storage determined by the voltage states of the storage nodes 106, 108. Once transferred, this data may be read from the SRAM cell in a standard fashion.

Programming of the resistance switching elements 202 and 204 according to one example will now be described with reference to FIGS. 3, 4A, 4B and 5.

Figure 3:
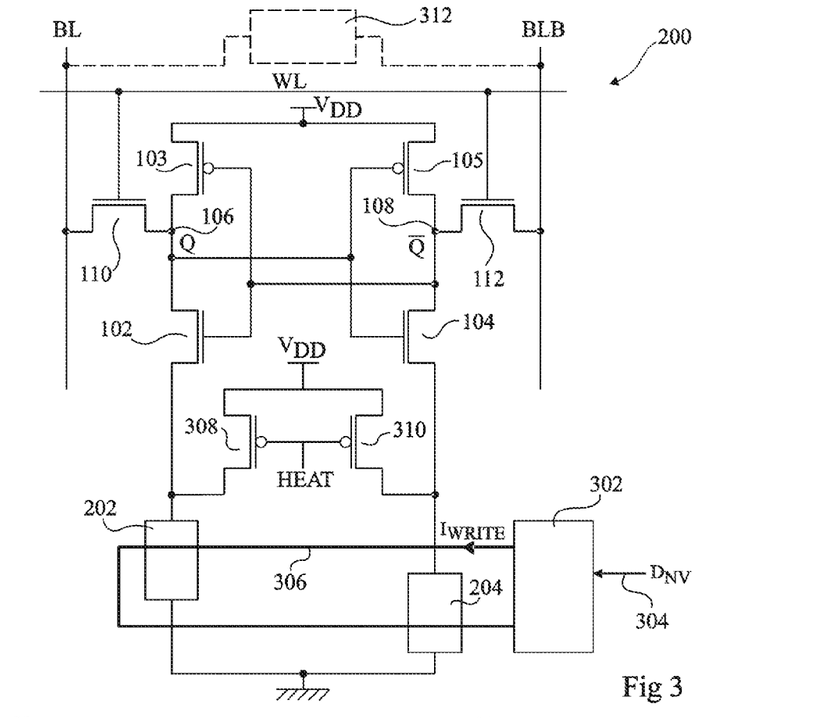
FIG. 3 illustrates programming circuitry for programming the non-volatile portion of the memory cell of FIG. 2.

FIG. 3 illustrates the memory cell 200 along with write control circuitry 302 arranged to program the resistance switching elements 202 and 204 based on one bit of non-volatile data $D_{NV}$ received on an input line 304. In particular, based on the non-volatile data $D_{NV}$, the circuitry 302 generates a write current $I_{WRITE}$, which is provided on a conductive track 306 that passes by the resistance switching elements 202 and 204. The current $I_{WRITE}$ flowing through the conductive track 306 generates a magnetic field, which passes through the resistance switching elements, and programs their resistive state.

In the case of thermally assisted switching MRAM, prior to supplying the write current to program each of the resistance switching elements 202, 204, the resistance switching elements are heated by passing a current through them, which aids the transition from one resistive state to another.

According to one example illustrated in FIG. 3, heating circuitry is provided that comprises PMOS transistors 308 and 310 coupled between the supply voltage $V_{DD}$ and the resistance switching elements 202, 204 respectively. The transistors 308 and 310 are activated by a control signal "HEAT" at their gate terminals to conduct currents that pass through each resistance switching element 202, 204.

Alternatively or additionally, heat control circuitry 312 is for example provided, which applies to each of the bit lines BL and BLB a voltage, for example equal to or greater than the supply voltage $V_{DD}$. Then, by activating the transistors 110 and 112 by a logic high voltage on word line WL, a current will flow from the bit lines BL and BLB through the corresponding resistance switching elements 202, 204 to the ground voltage.

Figure 4A:
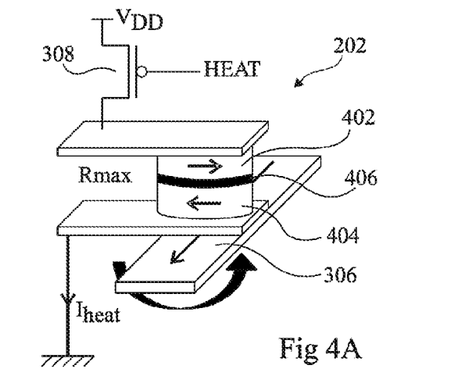
FIGS. 4A and 4B schematically represent examples of the programming of a specific resistance switching memory device.
Figure 4B:
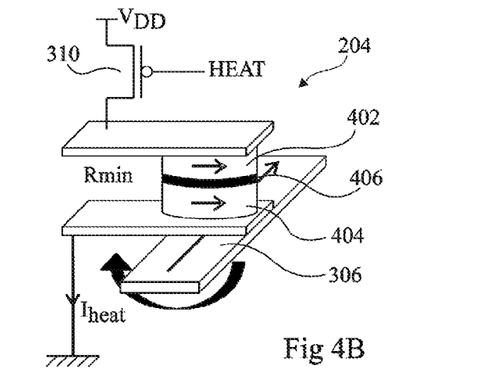

FIGS. 4A and 4B show the resistance switching elements 202, 204 in more detail in the example that they are TAS elements. Each of the resistance switching elements 202, 204 comprises a pinned ferromagnetic plate 402 and a free ferromagnetic plate 404, plates 402 and 404 sandwiching a tunnel oxide layer 406. The conductive track 306 passes close to the free plate 404 of ferromagnetic material, such that it is affected by the magnetic field generated by the current $I_{WRITE}$ flowing through track 306. The pinned plate 402 for example has a magnetic orientation in a first direction, while the magnetic orientation of plate 404 may be programmed, by the polarity of the current $I_{WRITE}$, to be in the same or opposite direction to that of plate 402. However, programming only occurs in elements that have already been heated, as described in more detail below.

FIG. 4A illustrates the case in which the magnetic orientations are in opposite directions in the plates 402, 404, resulting in a maximum resistance $R_{max}$ of the resistance switching element 202, for example in the range 2 k to 5 k Ohms.

FIG. 4B illustrates the case in which the magnetic orientations are in a same direction in the plates 402 and 404, resulting in a minimum resistance $R_{min}$ of the resistance switching element 204, for example in the range of 100 to 3 k Ohms.

The conductive track 306 is arranged such that the current $I_{WRITE}$ passes by each resistance switching element 202, 204 in opposite directions, one of which corresponds to the magnetic orientation of the pinned plate 402, and the other being the opposite orientation. Thus, a same current $I_{WRITE}$ can be used to program both the resistive states of the resistance switching element 202 and 204 at the same time, one of which is equal to $R_{max}$, and the other to $R_{min}$.

Figure 5:
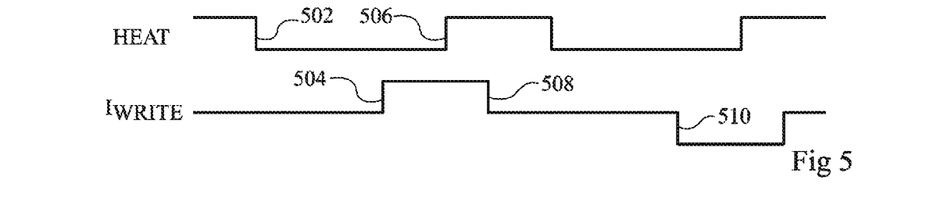
FIG. 5 is a timing diagram illustrating an example of the signals used for programming the non-volatile portion of the memory cell of FIG. 3.

FIG. 5 is a timing diagram illustrating an example of the signal HEAT in the case that the transistors 308, 310 are present, and the signal $I_{WRITE}$ during the programming of the resistance switching elements 202, 204. In the case that circuitry 312 is additionally or alternatively present, the signal WL is for example the inverse of the heat signal HEAT.

The signal HEAT falls low at falling edge 502, thereby activating the transistors 308 and 310. This generates a current $I_{HEAT}$ through the resistance switching elements 202 and 204, and after a certain period, the signal $I_{WRITE}$ is asserted, as shown by the rising edge 504 of this signal. In the example of FIG. 5, at rising edge 504 the current becomes positive, which for example programs element 202 to be at a high resistance value $R_{max}$, and element 204 to be at low resistance $R_{min}$.

Next, the signal HEAT is brought high again by rising edge 506, such that the heating current $I_{HEAT}$ is stopped, and the resistance switching elements 202, 204 cool in their current resistive state. Then the signal $I_{WRITE}$ is brought low by a falling edge 508, to end the programming process.

The subsequent transitions of the signals in FIG. 5 correspond to the programming of opposite resistive states of the resistive elements 202, 204. These transitions are identical to those previously described, except that the signal $I_{WRITE}$ becomes negative by falling edge 510, rather than positive, to program the opposite resistive states.

In one example, the time during which the signal HEAT is active between edges 502 and 506 is around 20 ns. Thus a write operation can be achieved in little more than 35 ns. However, the heating and cooling-off times will vary based on factors such as the materials used, their volumes, etc., and also the heat currents that are applied, and thus the above values are given only as approximate examples.

The current $I_{WRITE}$ is for example in the region of 10 mA for programming one value of the data bit, or in the region of −10 mA for programming the opposite value of the data bit, although other values could be used.

Figure 6:
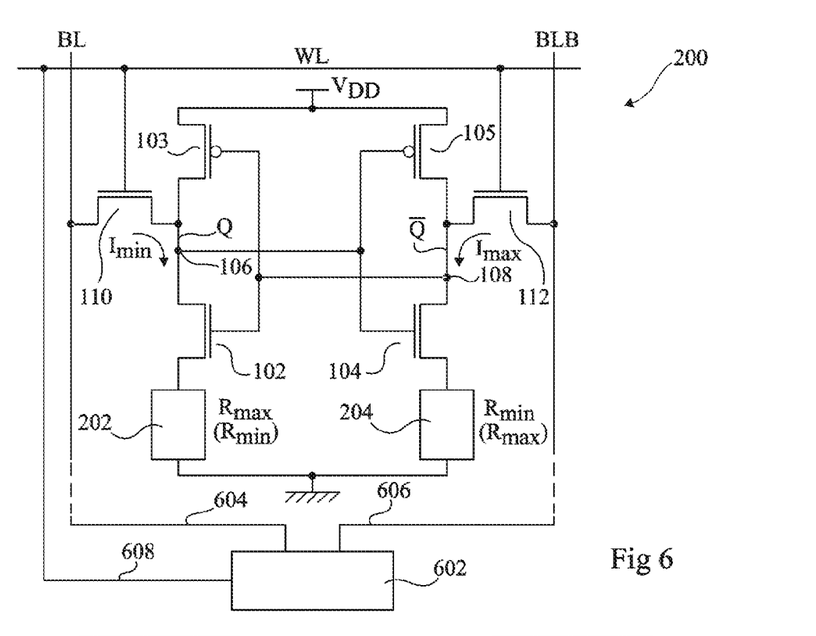
FIG. 6 illustrates an example of control circuitry for copying data stored by non-volatile data storage elements to volatile data storage elements of the memory cell.

FIG. 6 illustrates the memory cell 200 along with transfer control circuitry 602, for controlling the transfer of data stored in the non-volatile portion of the memory cell to the volatile data storage portion. In particular, the circuitry 602 comprises output lines 604 and 606 coupled to bit lines BL and BLB respectively, and an output line 608 coupled to the word line WL.

The signals on the word line WL and bit lines BL, BLB during a non-volatile to volatile transfer phase will now be described with reference to FIGS. 7A and 7B.

In general, the transfer phase comprises applying, by the control circuitry 602, a supply voltage to each of the storage nodes 106, 108, via the bit lines BL and BLB and NMOS transistors 110, 112. In particular, the supply voltage $V_{DD}$ is applied to the bit lines B and BLB, while the word line signal WL is high, thereby activating transistors 110, 112. This has the effect of turning off transistors 103, 105, and activating transistors 102 and 104, and thereby generating a current through each of the resistance switching elements 202, 204. A voltage divider is thus formed on each side of the memory cell, and the voltages at nodes 106, 108 will depend on the relative resistances of the elements 202, 204.

Figure 7A:
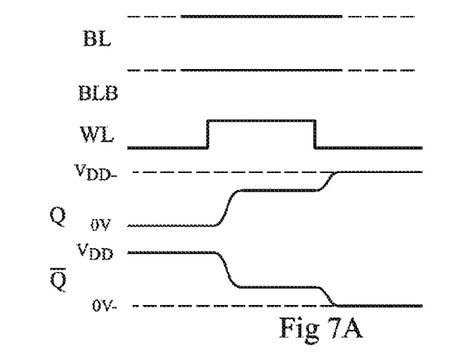
FIGS. 7A and 7B are timing diagrams showing examples of signals in the circuitry of FIG. 6.
Figure 7B:
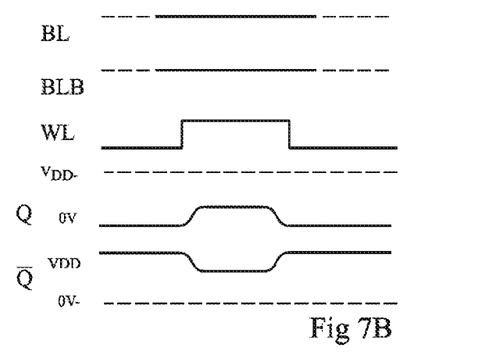

FIGS. 7A and 7B show timing diagrams illustrating the voltages on the bit lines BL and BLB, as well as on the word line WL, and the corresponding voltages Q and $\overline{Q}$ at the storage nodes 106 and 108.

Initially, the circuitry 602 applies a high voltage to each of the bit lines BL, BLB, for example at the supply voltage $V_{DD}$. The bit lines BL and BLB are likely to be close to or at the supply voltage $V_{DD}$ during a standby or read phase prior to the transfer phase, but during such phases they are generally only periodically charged to the supply voltage, and for this reason the voltages of BL and BLB prior to and after the transfer phase have been indicated by dashed lines in FIGS. 7A and 7B. On the contrary, during the transfer phase, the supply voltage is constantly applied to the bit lines BL, BLB, as indicated by solid lines in FIGS. 7A and 7B, such that currents may be drawn from the bit lines.

Then, the word line voltage WL is brought high, to activate the transistors 110 and 112.

FIG. 7A assumes that the SRAM cell is initially in a state in which Q is low and $\overline{Q}$ is high. Thus initially, transistor 104 will be non-conducting, and transistor 102 conducting. However, it is also assumed that resistance switching element 202 has a resistance $R_{max}$, and thus the current flowing through it will be limited. This current causes the voltage Q to rise towards $V_{DD}$, which in turn activates transistor 104, causing a second current to flow through resistor 204, which has a low resistance $R_{min}$. This will also reduce the voltage $\overline{Q}$ towards 0 V. The NMOS transistors 110, 112 are chosen to have equal dimensions and thus very similar off resistances, such that the voltage drop across each transistor 110, 112 will be proportional to the current level flowing through it. Thus, the lower voltage drop across transistor 110 will cause a higher voltage Q at node 106. Therefore, due to the difference in the resistances of resistive elements 202 and 204, the equilibrium position will be that the voltage Q at node 106 is closer to $V_{DD}$, and the voltage $\overline{Q}$ at node 108 will be closer to 0 V. Then, the word line voltage goes low, isolating the storage nodes 106, 108 from bit lines BL and BLB, and the states of Q and $\overline{Q}$ will settle to the closest stable state. In particular, due to the voltage difference, even if small, between the voltages Q and $\overline{Q}$, the storage nodes 106, 108 will settle to a state in which Q is high and $\overline{Q}$ is low, which corresponds to the state stored by the elements 202 and 204.

FIG. 7B illustrates the case in which Q and $\overline{Q}$ are again initially equal to 0 V and $V_{DD}$ respectively, but in which element 202 is at $R_{min}$, and element 204 at $R_{max}$. In this case, transistor 102 will initially still be conducting, and transistor 104 non-conducting, but again the voltage at node 106 will rise due to the current flowing through the resistance switching element 202. However, when the current through element 204 starts to rise, it will be a low current due to the high resistance of element 204, and thus the voltage $\overline{Q}$ will stay relatively high, and the voltage Q relatively low. Then, when the word line voltage WL is brought low again, isolating the storage nodes 106, 108 from the respective bit lines, the states of storage nodes 106, 108 will settle back to their original states, in which Q is low and $\overline{Q}$ is high.

In both FIGS. 7A and 7B, the duration that the supply voltage is applied to the bit lines BL and BLB is for example in the region of 1 ns, and thus such a data transfer from the non-volatile storage to the volatile storage can be performed in approximately only 1 ns, a time comparable to the read and write times of the SRAM portion of the memory cell 200.

Figure 7C:
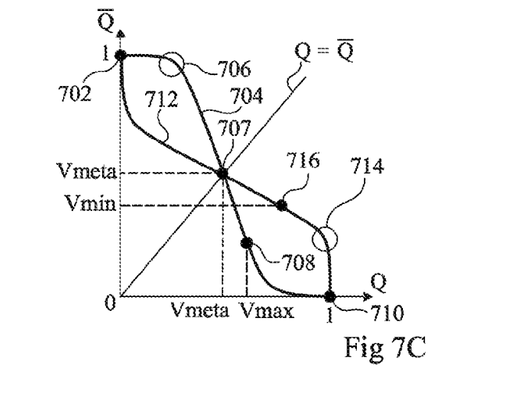
FIGS. 7C and 7D are graphs illustrating the transition between stable states of the cell of FIG. 6 according to one example.
Figure 7D:
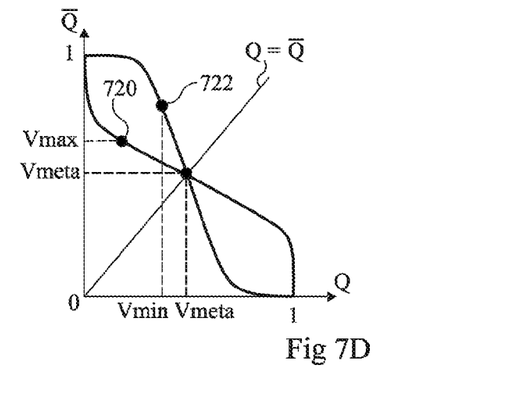

FIGS. 7C and 7D are graphs illustrating the transitions between different states of Q and $\overline{Q}$.

FIG. 7C illustrates the case of a transition to a high Q, low $\overline{Q}$ state. If starting from the low Q, high $\overline{Q}$ state labelled 702, as Q starts to rise, the curve 704 will be followed, in which initially $\overline{Q}$ falls slowly until a corner 706 is reached and transistor 104 starts to turn on. Then $\overline{Q}$ falls more quickly as Q rises and a point of metastability 707 is passed, at which point Q and $\overline{Q}$ are equal. Q will then reach a voltage Vmax at a point 708, resulting from the relatively large voltage drop across resistance $R_{max}$ and transistor 102. From this point 708, the closest stable state is the high Q, low $\overline{Q}$ state. Thus, when the signal WL is brought low, the high Q, low $\overline{Q}$ state, labelled 710, will be reached, $\overline{Q}$ quickly falling to logic 0, shortly before Q reaches the logic 1 state.

Alternatively, if starting from the high Q, low $\overline{Q}$ state 710, a curve 712 of FIG. 7C will be followed, in which Q will initially fall very slowly as $\overline{Q}$ rises, until a corner 714 is reached when transistor 102 starts to turn on. Q then falls more quickly to a point 716 when $\overline{Q}$ is at Vmin, resulting from the relatively small voltage drop across resistance $R_{min}$ and transistor 104. In this example, the metastability point 707 has not been crossed, and from this point 716, the closest stable state is back to the high Q, low $\overline{Q}$ state. Thus, when the signal WL is brought low, Q will quickly return to the logic 1 state, before $\overline{Q}$ drops again to the logic 0 state.

In FIG. 7D, the same curves as 7C are shown, but for the transitions to a low Q, high $\overline{Q}$ state, corresponding to an opposite magnetic state of elements 202, 204 to the example of FIG. 7C. Thus the Vmax point 720 and Vmin point 722 are both closest to the low Q, high $\overline{Q}$ state.

As demonstrated by the curves of FIGS. 7C and 7D, irrespective of the initial states of the voltages Q and $\overline{Q}$, the new states of these voltage will be determined by the programmed resistance values of elements 202 and 204. In particular, elements 202 and 204 result in an intermediate state 708, 716, 720 or 722, in which the values of Q and $\overline{Q}$ are closest to the stable state corresponding to the programmed states of elements 202, 204.

In alternative embodiments to that of FIG. 2, the element 202 or 204 could be replaced by a resistor having a fixed resistance of between $R_{min}$ and $R_{max}$, for example equal to $R_{min}+(R_{max}-R_{min})/2$.

Figure 8:
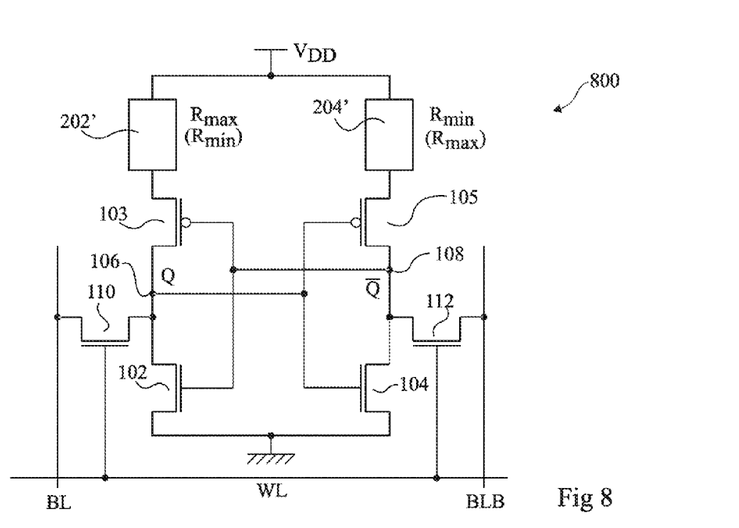
FIG. 8 illustrates a memory cell with non-volatile data storage according to a further embodiment of the present disclosure.

FIG. 8 illustrates a memory cell 800, which is the same as the memory cell 200 of FIG. 2, except that the resistance switching elements, labelled 202' and 204' in FIG. 8, are coupled respectively between the transistors 103, 105 and the supply voltage $V_{DD}$, and thus transistors 102, 104 are coupled directly to ground.

The circuit 800 operates in a similar fashion to the circuit 200. However, the circuitry 312 of FIG. 3 will apply a low voltage to the bit lines to heat the resistance switching elements 202', 204'. Furthermore, in the circuit 800, the heating transistors 308, 310 of FIG. 3 could be implemented by NMOS transistors coupled between the elements 202', 204' and the ground voltage. Additionally, a low supply voltage, for example at 0 V, will be applied by circuitry 602 of FIG. 6 to the bit lines BL, BLB during the transfer phase from the non-volatile storage elements 202', 204' to the volatile storage nodes 106, 108. This will have the effect of activating transistors 103 and 105, and deactivating transistors 102 and 104, such that the currents flowing through elements 202', 204' will depend on the programmed resistances of these elements, thereby setting the voltage states of nodes 106 and 108.

Figure 9:
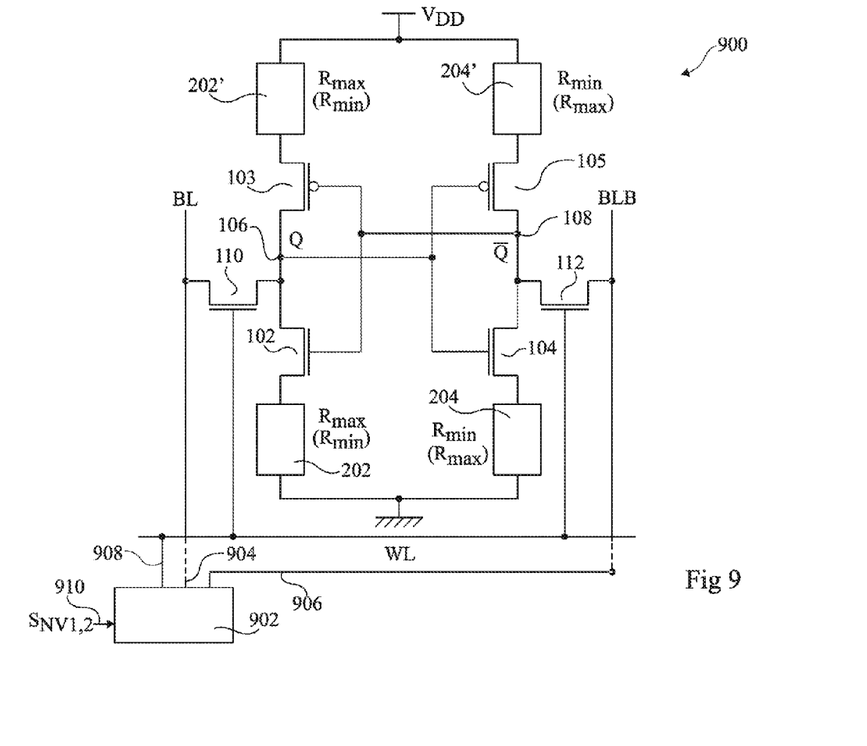
FIG. 9 illustrate a memory cell with non-volatile data storage according to yet a further embodiment of the present disclosure.

FIG. 9 illustrates a memory cell 900, which is the same as the memory cell 800 of FIG. 8, except that it additionally comprises a pair of resistance switching elements 202, 204 coupled between transistors 102, 104 respectively and ground. Each pair of elements 202, 204 and 202', 204' is programmed to store an independent bit of non-volatile data, and either of these bits can be transferred to the storage node 106, 108, as will be described in more detail below.

To program the elements 202, 204, they are for example heated by the heating circuitry 308, 310 and/or heat control circuitry 312 of FIG. 3, prior to being programmed by write control circuitry 302. To program elements 202', 204', they are for example heated by transistors similar to transistors 308 and 310 of FIG. 3, but coupled to ground, and/or by applying a low voltage to the bit lines BL and BLB by the heat control circuitry 312.

Transfer control circuitry 902 controls the transfer of non-volatile data to the storage nodes 106, 108. Circuitry 902 has output lines 904 and 906 coupled to the bit lines BL and BLB respectively, and an output line 908 coupled to the word line WL. It receives on an input line 910 a selection signal $S_{NV1,2}$, which indicates whether the bit stored by elements 202, 204 or by elements 202', 204' is to be transferred. Based on this selection, the circuitry 902 applies to the bit lines BL and BLB either a high voltage level, for example equal to $V_{DD}$, to transfer the data bit stored by elements 202, 204, or a low voltage level, for example at ground, to transfer the data bit stored by elements 202', 204'. Then, circuitry 902 asserts the word line signal WL to activate transistors 110 and 112, and depending on the voltage level on the bit lines BL and BLB, the voltage states at nodes 106, 108 will depend on either the programmed resistances of either elements 202, 204 or elements 202', 204'.

Figure 10:
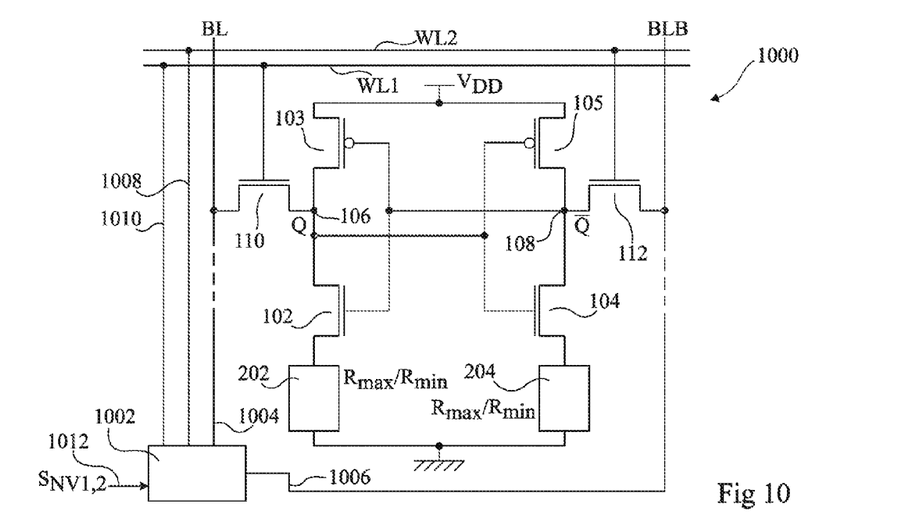
FIG. 10 illustrates a memory cell with non-volatile data storage according to yet a further embodiment of the present disclosure.

FIG. 10 illustrates a memory cell 1000 according to a further embodiment, which is the same as memory cell 200 of FIG. 2, but in which each of the resistive switching elements 202, 204 is independently programmed to have one of the two resistance states $R_{min}$ and $R_{max}$. Thus each element 202, 204 can independently store a non-volatile data bit. Furthermore, rather than a single word line WL, two word lines WL1 and WL2 are provided, WL1 being coupled to the gate of transistor 110, and WL2 to the gate of transistor 112. These two word lines enable the selection of the non-volatile date bit stored by element 202 or by element 204 to be transferred to the volatile storage nodes 106, 108, as will be described below.

To program the resistance of each of the elements 202, 204, they are for example heated as described above with reference to FIG. 3, and a write control block like the block 302 of FIG. 3 is for example provided for each element, allowing independent write currents to be applied to program each element.

Transfer control circuitry 1002 is coupled via lines 1004 and 1006 to the bit lines BL and BLB respectively, and via lines 1008 and 1010 to the word lines WL1 and WL2 respectively. A selection signal $S_{NV1,2}$ on an input line 1012 of circuitry 1002 indicates whether the non-volatile data bit stored by element 202 or by element 204 is to be transferred to the volatile storage nodes 106, 108. Such a transfer will now be described with reference to FIGS. 11A to 11D.

Figures 11A, 11B:
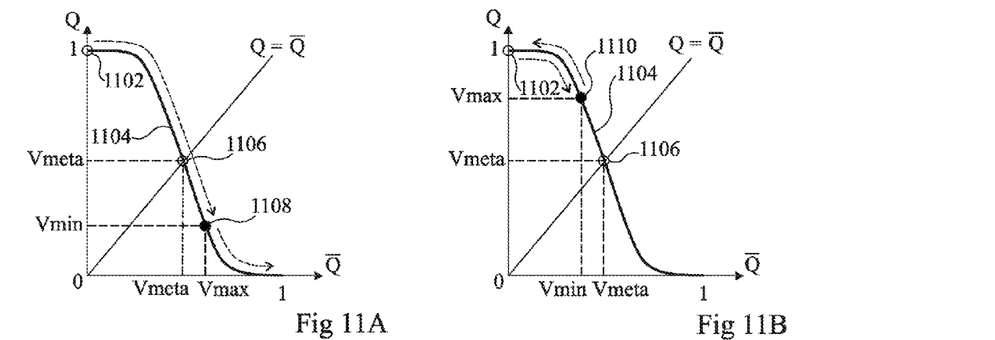
FIGS. 11A to 11D are graphs illustrating the transition between stable states of the cell of FIG. 10 according to some embodiments of the present disclosure.

FIGS. 11A and 11B are graphs illustrating the state of the storage node 108 during a transfer phase.

Initially, the storage node connected to the element 202 or 204 that is to be read, as indicated by the selection signal $S_{NV1,2}$, is set to a low value. In the example of FIGS. 11A and 11B, element 204 is to be read, and thus a low logic level is applied to storage node 108, and a high logic level to storage node 106. For example, this achieved by performing a write operation, which programs a logic 1 at node 106 and a logic 0 at node 108. Thus, in both FIGS. 11A and 11B, the initial state 1102 corresponds to the high Q, low $\overline{Q}$ state.

The transfer control circuitry 1002 then applies a high voltage to the word line WL2 to activate transistor 112, while maintaining a low voltage on word line WL1. The supply voltage level is also applied by circuitry 1002 to the bit line BLB. This results in a current flowing from the bit line BLB through transistors 112, 104 and the resistance switching element 204 to ground. Thus transistors 112, 104 and element 204 form a potential divider, and the voltage at node 108 will depend on the programmed resistance of element 204.

In the case of FIG. 11A, the resistance of element 204 is $R_{max}$, and thus the voltage at node 108 follows a curve 1104 and passes a point of metastability 1106, before reaching a point 1108 at which $\overline{Q}$ is at a level Vmax resulting from resistance $R_{max}$. Then, when circuitry 1002 brings the voltage on word line WL2 low again to turn off transistor 112, the storage nodes 106 and 108 go to the closest stable state, which is the low Q, high $\overline{Q}$ state.

In the case of FIG. 11B, the resistance of element 204 is at $R_{min}$, and thus the voltage at node 108 follows a curve 1104 but does not pass the point of metastability 1106. Instead, it stops at a point 1110 at which $\overline{Q}$ is at a level Vmin resulting from the resistance $R_{min}$. Then, when circuitry 1002 brings the voltage on word line WL2 low again to turn off transistor 112, the storage nodes 106 and 108 go to the closest stable state, which is the high Q, low $\overline{Q}$ state.

Figures 11C, 11D:
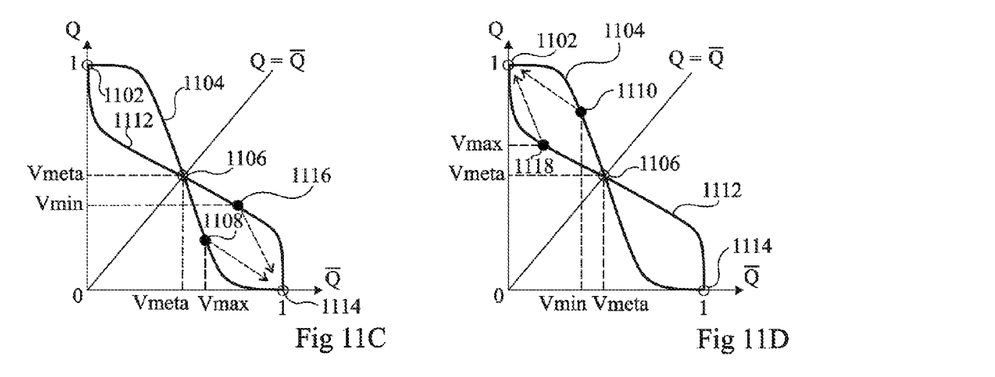

FIGS. 11C and 11D each illustrate the curve 1104 described above corresponding to reading of the non-volatile data bit stored by element 204, and also a curve 1112 corresponding to reading of the non-volatile data bit stored by element 202. For curve 1112, the starting state is the low Q, high $\overline{Q}$ state, labelled 1114. As shown in FIG. 11C, if the element 202 is at $R_{min}$, the voltage at node 106 will follow curve 1112 to a point 1116, at which Q is at a voltage Vmin, without passing the point of metastability 1106. From point 1116, the closest stable state is the low Q, high $\overline{Q}$ state. Alternatively, as shown in FIG. 11D, if the element 202 is at $R_{max}$, the voltage at node 106 will follow curve 1112 past the point of metastability 1106 to a point 1118, and thus the closest stable state is the high Q, low $\overline{Q}$ state.

The values of the resistances $R_{min}$ and $R_{max}$ of elements 202 and 204 are for example chosen such that, when the supply voltage is applied to the corresponding bit line BL, BLB, the corresponding voltages Vmin and Vmax satisfy the relation Vmin<Vmet<Vmax, where Vmet is the voltage at nodes 106 and 108 corresponding to the point of metastability 1106 of the SRAM portion of the memory cell.

In an alternative embodiment to that of FIG. 10, either of the elements 202, 204 could be removed resulting in a simple structure storing one volatile and one non-volatile data bit. In that case, rather than two word lines WL1, WL2, a single word line could be used. Alternatively, keeping the two word lines WL1, WL2, it would be possible to perform a read or write operation on only the branch having no resistance switching element, by selectively activating the corresponding transistor 110, 112 during that operation. This leads to a faster read or write operation. Furthermore, in such a case, a higher resistance of the element 202/204 can be used, for example having a maximum resistance $R_{max}$ greater than 5 k ohms. Thus there will be less chance of a bit flip during a read operation.

Figure 12:
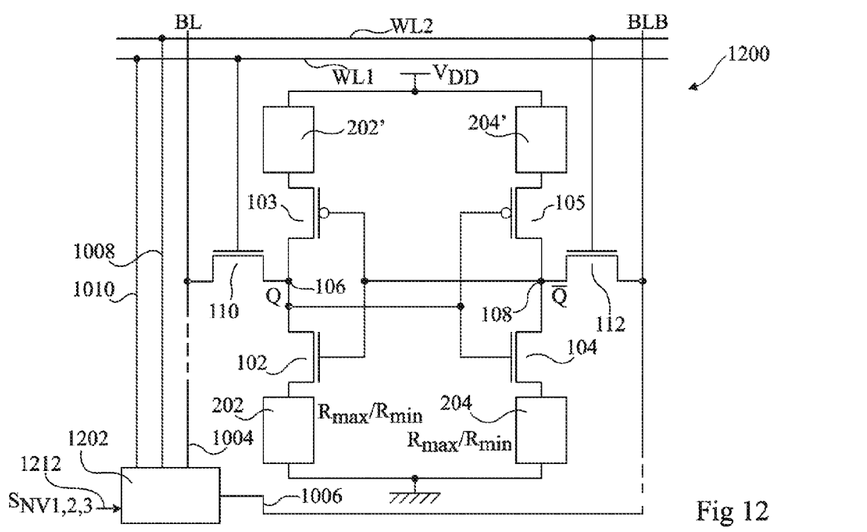
FIG. 12 illustrates a memory cell with non-volatile data storage according to a further embodiment of the present disclosure.

FIG. 12 illustrates a memory cell 1200 according to yet a further embodiment, which is the same as the embodiment 1000 of FIG. 10, but additionally comprises a pair of resistance switching elements 202', 204' couple between transistors 103 and 105 respectively and the supply voltage $V_{DD}$. The elements 202 and 204 are independently programmed to store two bits of non-volatile data, while the elements 202' and 204' are programmed to have different resistances $R_{min}$, $R_{max}$, and thus together store one bit of non-volatile data. Thus, the memory cell 1200 may store one bit of volatile data at nodes 106 and 108, and three bits of non-volatile date.

Operation of the memory cell 1200 is identical to that of memory cell 1000 of FIG. 10, except that the transfer control circuitry 1002 is replaced by circuitry 1202, which is additionally arranged to transfer the data stored by elements 202' and 204' to the storage nodes 106, 108 by applying low voltages to the bit lines BL and BLB, and then activating transistors 110 and 112. Circuitry 1202 receives a selection input $SN_{V1,2,3}$ on a line 1212 indicating which non-volatile data bit is to be transferred to nodes 106, 108.

Furthermore, the embodiment of FIG. 12 could be extended to store four non-volatile data bits, by independently programming the resistance switching elements 202, 204. In this case, circuitry 1202 is additionally arranged to transfer the data stored by either of element 202 or 204 to the storage nodes 106, 108 using the same technique described in relation to FIG. 10, except that a low voltage will be coupled to the corresponding bit line while the corresponding transistor 110, 112 is activated. Circuitry 1202 would also receive a selection input $SN_{V1,2,3,4}$ on line 1212 indicating which of the four non-volatile data bits is to be transferred to nodes 106, 108. In such an embodiment, in order to compensate for the different on resistances of the various transistors 102 to 105, the minimum resistance $R_{min}$ of elements 202', 204' is for example choses to be lower than the minimum resistance $R_{min}$ of elements 202, 204, and the maximum resistance $R_{max}$ of elements 202', 204' is for example chosen to be lower than the maximum resistance $R_{max}$ of elements 202, 204. For example, for elements 202, 204, $R_{min}$ could be 2.5 k ohms and $R_{max}$ could be 5 k ohms, while for elements 202' and 204', $R_{min}$ could be 1.5 k ohms, and $R_{max}$ could be 3 k ohms. For example, in the case that the elements 202, 204, 202' and 204' are implemented by magnetic tunnelling junctions, this could be achieved by choosing a diameter of 120 nm for elements 202 and 204 and a diameter of 140 nm for elements 202' and 204'.

Figure 13:
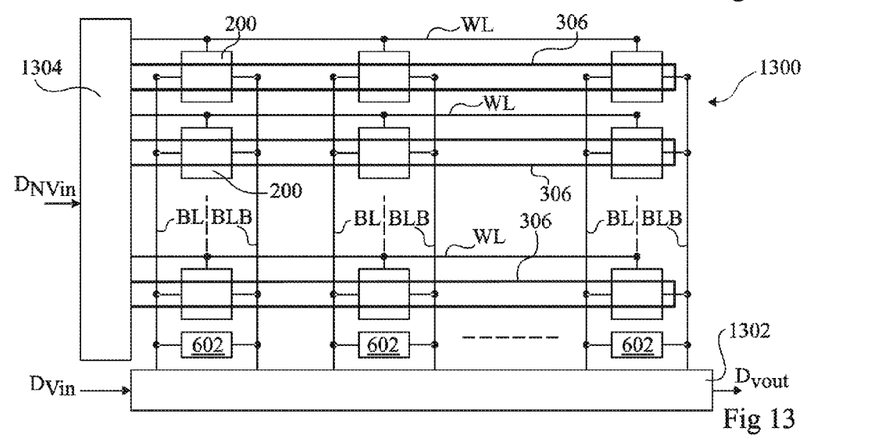
FIG. 13 illustrates a memory array according to an embodiment of the present disclosure.

FIG. 13 illustrates a memory array 1300 of the memory cells 200, although cell 200 could be replaces by any of the memory cells 800, 900, 1000 or 1200 discussed above. The memory cells 200 are arranged in columns and rows, each cell being coupled to bit lines BL and BLB common to each of the columns. The bit lines are coupled to control circuitry 1302, which for example receives volatile input data $D_{VIN}$, and volatile output data $D_{VOUT}$, which could be the externally inputted volatile data, or volatile data that is generated from a transfer of the non-volatile data stored by the resistance switching elements. The circuitry 1302 for example also controls the voltages on the bit lines BL and BLB during the transfer phase, and if appropriate during the writing of non-volatile data.

Each of the cells 200 is also coupled to a corresponding word line WL common to each row of cells, although obviously if the memory cells are those of FIG. 10 or 12 two such word lines would be provided for each row. A conductive track 306 forms a loop passing by each cell and conducting the current $I_{WRITE}$ for writing to the resistance switching elements of each of the memory cells. In embodiments in which the cell store more than one bit of non-volatile data, more than one conductive track 306 is for example provided, one for each independently programmable element/pair of elements.

Each of the lines WL and 306 is controlled by control circuitry 904, which receives input one or more bits of non-volatile data $D_{NVin}$, and provides the current $I_{WRITE}$ of the corresponding polarity on one or more tracks.

The writing of the non-volatile data is for example performed row by row, in two phases. During a first phase, only the resistance switching elements of cells for which a first logic value, such as logic "0", is to be programmed are heated. Then, when the corresponding write current is applied to the one or more conductive track 306, the resistive states of only the elements that have been heated will be programmed. During the second phase, the resistance switching elements of the other cells, for which the second logic value, for example a logic "1", is to be programmed are heated. Then, when the corresponding write current is applied to the one or more conductive track 306, again only the resistive states of the elements that have been heated will be programmed.

As indicated by dashed lines in FIG. 13, the memory array 1300 may comprise any number of rows of cells and any number of columns of cells, depending on the desired storage capacity.

The example of FIG. 13, in which a common track 306 is used for each row of memory cells, has the advantage of being efficient in terms of energy consumption. Indeed, a single current on each track 306 can be used to program multiple memory cells of the row.

As an alternative, a common track 306 could be used for each column, which has the advantage that a row of memory cells can all be programmed in a single programming cycle. Furthermore, given that a current generator provides the current on each track 306, the number current generators would then be reduced to the number of columns rather than the number of rows of the memory.

Figure 14A:
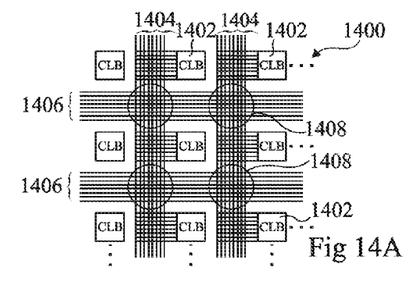
FIG. 14A illustrates a field programmable gate array (FPGA) according to an embodiment of the present disclosure.

FIG. 14A illustrates an FPGA (field programmable gate array) 1400 in which the memory cells 200, 800, 900, 1000 or 1200 described herein may be implemented. The FPGA comprises an array of configurable logic blocks (CLB) 1402 selectively interconnected by columns of lines 1404, which in turn are selectively interconnected with rows of lines 1406. In particular, switch blocks 1408 are provided at each intersection between column lines 1404 and row lines 1406, allowing the connections between the each of the column lines 1404 with each of the row lines 1406 to be programmed. The switching blocks 1408 for example comprise one or more of the memory cells 200, 800, 900, 1000 or 1200, allowing the connections between the lines to be programmed in a non-volatile fashion. Furthermore, in the case that the memory cells 900, 1000 or 1200 are used to program the connections, one of a plurality of connection configurations may be selected by selecting which of the non-volatile data bits is transferred to the storage nodes 106, 108 of each cell.

Figure 14B:
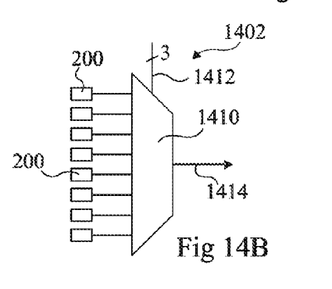
FIG. 14B illustrates a configurable logic block of the FPGA of FIG. 14A in more detail according to an embodiment of the present disclosure.

FIG. 14B illustrates one of the CLB 1402 in more detail according to one example in which it comprises a look-up table formed of a multiplexer 1410 having 8 data inputs, each of which is coupled to a memory cell 200, although in alternative embodiments cell 200 could be replaced by cell 800, 900, 1000 or 1200 described above, and there could be any number of these cells and inputs to the multiplexer. The cell 200 outputs a data value from its volatile storage, i.e. one of the storage nodes 106, 108. In this implementation, the memory cells are not coupled to bit lines of a memory array, but to access lines, which could be bit lines, or lines coupled to just one memory cell. One of these access lines for example provides the output data value of the cell.

The multiplexer 1410 also comprises a 3-bit control input 1412, controlling which of the 8 input lines is selected, and an output line 1414, outputting the data of the selected input line.

An advantage of the embodiments of the memory cell described herein is that it is capable of storing not only one bit of volatile data, but additionally one bit of non-volatile data. Furthermore, the programmed non-volatile data can be quickly loaded to the volatile portion of the memory cell in a simple fashion, by application of a voltage to the access lines of the memory cell. This advantageously means that a state programmed in a non-volatile fashion may be quickly loaded (in less than 1 ns), for example upon activation of the memory on power-up or after a sleep period. In the case of an FPGA, this allows a circuit design to be quickly initialised, without the need of loading external data into the device to program memory latches and switches.

Furthermore, advantageously the cell is capable of fast (in around 1 ns) write and read operations for the volatile storage portions, which may occur in a normal fashion irrespective of the programmed states of the non-volatile resistive elements. Furthermore, the write time for the non-volatile portion is also relatively fast (in around 35 ns in the case of an MRAM).

A further advantage of the memory cells described herein is that the non-volatile data may be read without the need of additional transistors in each memory cell.

Furthermore, the resistance switching elements 202, 204 of FIGS. 2, 8, 9, 10 and 12 are for example formed in a metal layer above a silicon layer in which the transistors 102, 103, 104 and 105 are formed. The positioning of these resistance switching elements 202, 204 connected directly to the ground voltage or supply voltage $V_{DD}$ is thus advantageous as a single via may be used from the silicon layer to one terminal of each resistance switching element, and the other terminal of each element can be connected directly to the corresponding supply rail rather than returning on another via to the silicon layer.

An advantage of the embodiments of FIGS. 9, 10 and 12 is that multiple bits of non-volatile data may be stored in a single memory cell, and selectively accessed by transferring the selected bit to the volatile storage.

Having thus described at least one illustrative embodiment of the invention, various alterations, modifications and improvements will readily occur to those skilled in the art.

For example, it will be apparent to those skilled in the art that, while the invention has been described in relation to a memory array and FPGA, the memory cell described herein could be used in other types of memory devices, such as registers or flip-flops.

It will be apparent to those skilled in the art that the ground voltage described herein may be at 0 V, or more generally at any supply voltage $V_{SS}$, that could be different from 0 V.

Furthermore, it will be apparent to those skilled in the art that the various transistors described herein could be implemented by NMOS or PMOS devices. For example, rather than being implemented by NMOS transistors, the transistors 110, 112 could be implemented by PMOS transistors. Also, while the various embodiments have been described in relation to MOS transistors, it will be apparent to those skilled in the art that the invention could be equally applied to other transistor technologies, such as bipolar transistors.

Furthermore, the features described in relation to the various embodiments could be combined in alternative embodiments in any combination.

The invention claimed is:

1. A memory device comprising:
at least one memory cell comprising:
first and second pairs of transistors each pair coupled in series between first and second supply voltages, wherein a first storage node between the first pair of transistors is coupled to control terminals of the second pair of transistors, and a second storage node between the second pair of transistors is coupled to control terminals of the first pair of transistors; and
a first resistance switching element coupled between said first supply voltage and a first transistor of said first pair of transistors and programmed to have one of first and second resistances;
a fifth transistor directly coupled between said first storage node and a first access line; and
a sixth transistor coupled between said second storage node and a second access line, wherein said fifth transistor is controlled by a first control line and said sixth transistor is controlled by a second control line independent of the first control line.

2. The memory device of claim 1, further comprising:
control circuitry adapted to store a data value at said first and second storage nodes by coupling said first storage node to said first supply voltage and then coupling said first storage node to said second supply voltage, the data value being determined by the programmed resistance of the first resistance switching element.

3. The memory device of claim 2, wherein said control circuitry is arranged to couple said first storage node to said first and second supply voltages by activating said fifth transistor.

4. The memory device of claim 1, wherein the at least one memory cell further comprises a second resistance switching element coupled between said first supply voltage and a first transistor of said second pair of transistors and programmed to have one of first and second resistances.

5. The memory device of claim 4, further comprising:
control circuitry adapted to:
store a first data value at said first and second storage nodes by coupling said first storage node to said first supply voltage and then coupling said first storage node to said second supply voltage, the data value being determined by the programmed resistance of the first resistance switching element; and
store a second data value at said first and second storage nodes by coupling said second storage node to said first supply voltage, and then coupling said second storage node to said second supply voltage, the second data value being determined by the programmed resistance of the second resistance switching element.

6. The memory device of claim 1, wherein the at least one memory cell further comprises a further resistance switching element coupled between said second supply voltage and a second transistor of said first pair of transistors and programmed to have one of first and second resistances.

7. The memory device of claim 6, further comprising control circuitry adapted to store a further data value at said first and second storage nodes by coupling said first storage node to said first supply voltage, the data value being determined by the programmed resistance of the further resistance switching element.

8. The memory device of claim 7, wherein said control circuitry is adapted to select between storing said data value and said further data value at said first and second storage nodes by applying said first or second supply voltage to said first storage node.

9. The memory device of claim 1, wherein:
the at least one memory cell further comprises:
a third resistance switching element coupled between said second supply voltage and a second transistor of said first pair of transistors and programmed to have one of said first and second resistances; and
a fourth resistance switching element coupled between said second supply voltage and a second transistor of said second pair of transistors and programmed to have one of said first and second resistances; and
control circuitry adapted to store a further data value at said first and second storage nodes by coupling said first storage node to said first supply voltage, the data value being determined by the relative resistances of the third and fourth resistance switching elements.

10. The memory device of claim 1, further comprising programming circuitry adapted to program the resistances of said first resistance switching element based on input data.

11. The memory device of claim 1, wherein said first resistance switching element is one of:
an oxide resistive element;
a conductive bridging element;
a phase change element;
a programmable metallization element;
a spin-torque-transfer element;
a thermally assisted switching element and
a field-induced magnetic switching element.

12. A random access memory comprising an array of memory devices, each of the memory devices comprising the memory device of claim 1.

13. A field programmable gate array comprising at least one multiplexer comprising an input coupled to the memory device of claim 1.

14. A field programmable gate array comprising:
a plurality of configurable logic blocks; and
at least one switching block adapted to interconnect said plurality of configurable logic blocks, wherein said at least one switching block comprises the memory device of claim 1.

15. A method of transferring a data value from non-volatile storage of a memory cell to first and second volatile storage nodes of said memory cell, wherein the memory cell comprises first and second pairs of transistors each pair coupled in series between first and second supply voltages, wherein a first storage node between the first pair of transistors is coupled to control terminals of the second pair of transistors, and a second storage node between the second pair of transistors is coupled to control terminals of the first pair of transistors; a first resistance switching element coupled between said first supply voltage and a first transistor of said first pair of transistors and programmed to have one of first and second resistances; a fifth transistor directly coupled between said first storage node and a first access line; and a sixth transistor coupled between said second storage node and a second access line, wherein said fifth transistor is controlled by a first control line and said sixth transistor is controlled by a second control line independent of the first control line, the method comprising:
coupling said first storage node to said first supply voltage and then coupling said first storage node to said second supply voltage, the data value being determined by the programmed resistance of the first resistance switching element.

* * * * *